(12) United States Patent
Tilton et al.

(10) Patent No.: US 7,506,519 B1
(45) Date of Patent: *Mar. 24, 2009

(54) STAGGERED SPRAY NOZZLE SYSTEM

(75) Inventors: Charles L. Tilton, Colton, WA (US);
Tahir Cader, Liberty Lake, WA (US);
Nathan G. Muoio, Pullman, WA (US)

(73) Assignee: Isothermal Systems Research, Inc.,
Liberty Lake, WA (US)

( * ) Notice: Subject to any disclaimer, the term of this patent is extended or adjusted under 35 U.S.C. 154(b) by 335 days.

This patent is subject to a terminal disclaimer.

(21) Appl. No.: 11/137,137

(22) Filed: May 24, 2005

Related U.S. Application Data

(62) Division of application No. 10/723,608, filed on Nov. 26, 2003, now Pat. No. 7,013,662, which is a division of application No. 10/243,683, filed on Sep. 13, 2002, now Pat. No. 6,857,283.

(51) Int. Cl.
*F28D 3/00* (2006.01)
*F28D 5/00* (2006.01)
*F25D 23/12* (2006.01)

(52) U.S. Cl. .......................... 62/171; 62/259.2; 62/310

(58) Field of Classification Search ................ 62/171, 62/121, 304, 310, 259.2
See application file for complete search history.

(56) References Cited

U.S. PATENT DOCUMENTS

| | | | |
|---|---|---|---|
| 2,389,642 A * | 11/1945 | Schellin et al. | 239/441 |
| 6,205,799 B1 * | 3/2001 | Patel et al. | 62/132 |
| 6,378,789 B1 * | 4/2002 | Seaman et al. | 239/443 |
| 7,032,403 B1 * | 4/2006 | Tilton et al. | 62/259.2 |

* cited by examiner

*Primary Examiner*—William C Doerrler
(74) *Attorney, Agent, or Firm*—Michael S. Neustel

(57) ABSTRACT

A staggered spray nozzle system for efficiently thermally managing one or more electronic devices. The staggered spray nozzle system includes a first portion and a second portion positioned with the first portion. The first portion includes at least one first orifice for dispensing a first fluid flow towards at least one electronic device. A second portion is positioned within the first portion, wherein the second portion may be slidably positioned or non-movably positioned within the first portion. The second portion includes at least one second orifice for dispensing a second fluid flow towards at least one electronic device.

20 Claims, 18 Drawing Sheets

STAGGERED SPRAY NOZZLE SYSTEM

CROSS REFERENCE TO RELATED APPLICATIONS

I hereby claim benefit under Title 35, United States Code, Section 120 of U.S. patent application Ser. No. 10/723,608, filed Nov. 26, 2003 now U.S. Pat. No. 7,013,662 and is a divisional of Ser. No. 10/243,683 filed Sep. 13, 2002 which issued as U.S. Pat. No. 6,857,283. This application is a divisional of the Ser. No. 10/723,608 application. The Ser. No. 10/723,608 application and Ser. No. 10/243,683 application are hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to electronic device burn-in systems and more specifically it relates to a staggered spray nozzle system for efficiently thermally managing one or more electronic devices.

2. Description of the Related Art

Thermal management systems for electronic device burn-in equipment have been in use for years. Conventional thermal management systems utilized today are comprised of, for example, either air-cooled enclosures, or fluid-cooled cold plates. Upcoming technologies include refrigeration systems or other two-phase based technologies.

When producing electronic devices, manufacturers typically perform three different tests on the electronic devices prior to shipping: (1) sort, (2) burn-in, and (3) class testing. Sort test requires maintaining the wafers at a modest temperature, e.g. 35° Celsius, while the wafers are probed for defects. Conventional fluid-cooled cold plates are employed at this stage. Projected heat fluxes, even at the wafer sort, are pointing to the fact that a more effective thermal management technology is needed at this stage.

Burn-in of the electronic devices is typically accomplished utilizing elevated voltages and temperatures in a process that raises the junction temperatures of a batch of electronic devices. The lifespan of an electronic device is closely related to its operating temperature wherein operating under increased temperatures reduces the effective lifespan of the electronic device. By applying increased voltages and temperatures to an electronic device, the weaker electronic devices will fail during testing. The length of the burn-in of electronic devices is directly tied to the median junction temperature of the batch of electronic devices. It is therefore important to maintain a relatively narrow junction temperature spread that provides a higher median temperature. For example, a poor thermal management system can produce a junction temperature spread from 75° to 125° Celsius resulting in a low median junction temperature, longer burn-in time and higher associated burn-in costs. Modern fluid-based thermal management systems are currently able to lower the junction temperature spread to approximately 95° to 110° Celsius thereby reducing burn-in time and burn-in costs.

Class test is the final step in the testing process and is comprised of a final series of tests to validate functionality and quantify speeds. During class test, non-uniform heating of the electronic devices typically occurs. A electronic device's speed is typically derated by 0.15% for every degree Celsius rise above the target temperature (junction temperature, Tj). It is therefore important to maintain the temperature of the electronic devices relatively close to the target temperature (Tj).

Due to increasing chip heat fluxes (projected to exceed 125 W/cm$^2$ by the year 2004), conventional thermal management systems for electronic device burn-in are reaching their cooling limits. A further problem with conventional thermal management systems is that they are inefficient, complex, costly to implement and costly to operate. A further problem with conventional thermal management systems is that the resulting junction temperature spreads result in relatively long burn-in times of the electronic device devices. Another problem with conventional thermal management systems is that they require significant amounts of power to operate.

While these devices may be suitable for the particular purpose to which they address, they are not as suitable for efficiently thermally managing one or more electronic devices. Conventional staggered spray nozzle systems are inaccurate and inefficient thereby increasing the testing costs for an electronic device manufacturer.

In these respects, the staggered spray nozzle system according to the present invention substantially departs from the conventional concepts and designs of the prior art, and in so doing provides an apparatus primarily developed for the purpose of efficiently thermally managing one or more electronic devices.

BRIEF SUMMARY OF THE INVENTION

In view of the foregoing disadvantages inherent in the known types of electronic device burn-in systems now present in the prior art, the present invention provides a new staggered spray nozzle system construction wherein the same can be utilized for efficiently thermally managing one or more electronic devices.

The general purpose of the present invention, which will be described subsequently in greater detail, is to provide a new staggered spray nozzle system that has many of the advantages of the electronic device burn-in systems mentioned heretofore and many novel features that result in a new staggered spray nozzle system which is not anticipated, rendered obvious, suggested, or even implied by any of the prior art electronic device burn-in systems, either alone or in any combination thereof.

To attain this, the present invention generally comprises a first portion and a second portion positioned with the first portion. The first portion includes at least one first orifice for dispensing a first fluid flow towards at least one electronic device. A second portion is positioned within the first portion, wherein the second portion may be slidably positioned or non-movably positioned within the first portion. The second portion includes at least one second orifice for dispensing a second fluid flow towards at least one electronic device.

There has thus been outlined, rather broadly, the more important features of the invention in order that the detailed description thereof may be better understood and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a staggered spray nozzle system that will overcome the shortcomings of the prior art devices.

A second object is to provide a staggered spray nozzle system that efficiently thermally manages one or more electronic devices.

Another object is to provide a staggered spray nozzle system that minimizes junction temperature spread during electronic device testing procedures.

An additional object is to provide a staggered spray nozzle system that is energy efficient, flexible and relatively small in size.

Another object is to provide a staggered spray nozzle system that is capable of cooling a variety of electronic device devices using the same burn-in equipment.

An additional object is to provide a staggered spray nozzle system that transfers heat from an electronic device using conduction, convection, phase change or a combination thereof.

Another object is to provide a staggered spray nozzle system that works with existing and various types of burn-in and thermal management equipment currently utilized in the industry.

Another object is to provide a staggered spray nozzle system that is capable of managing the temperature of electronic devices that utilize an integrated heat sink and electronic devices that do not utilize an integrated heat sink.

A further object is to provide a staggered spray nozzle system that is capable of thermally managing one or more electronic devices of various shapes, sizes and structures.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
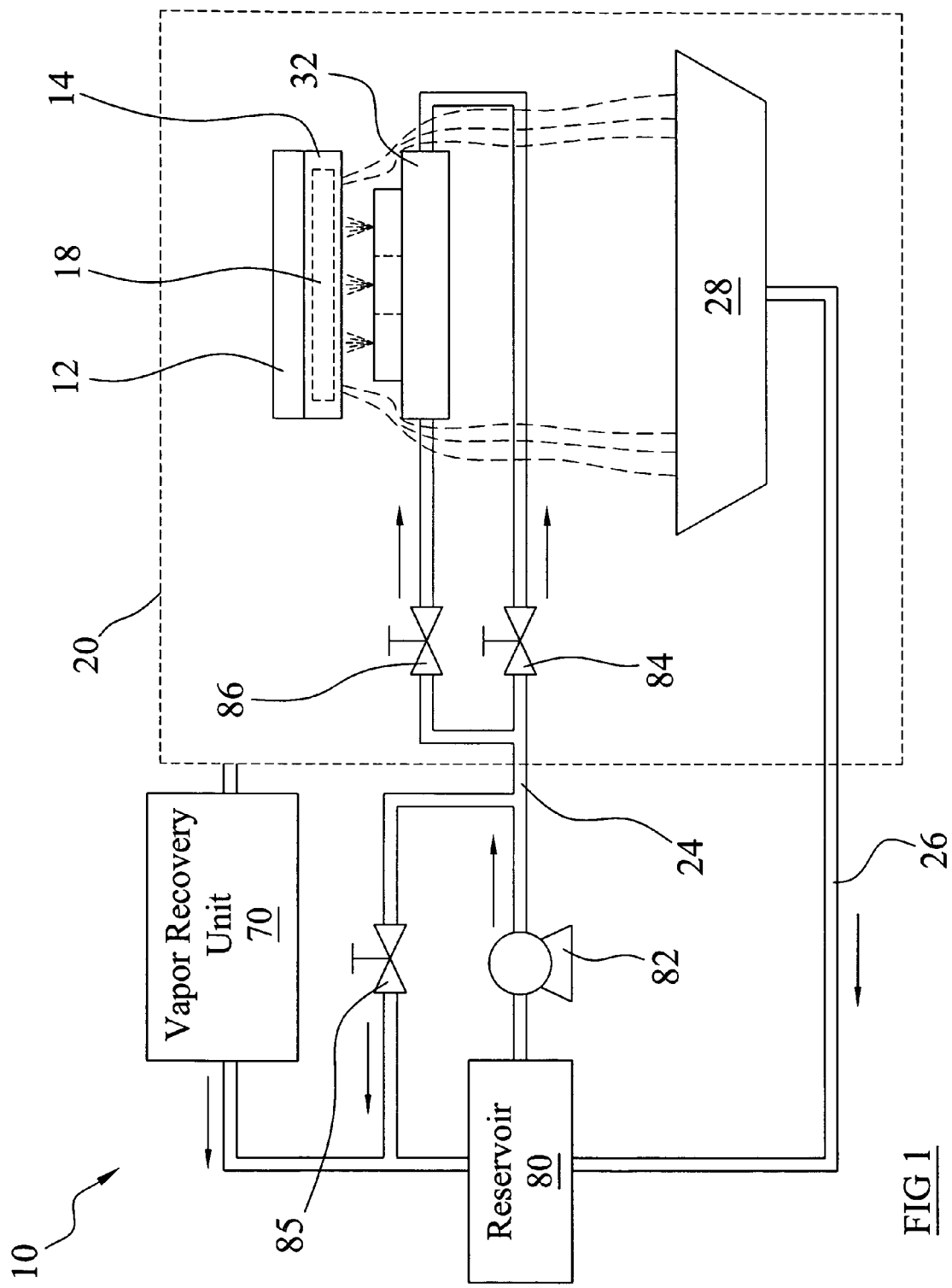
FIG. 1 is a schematic diagram illustrating the overall structure of the present invention.
Figure 2:
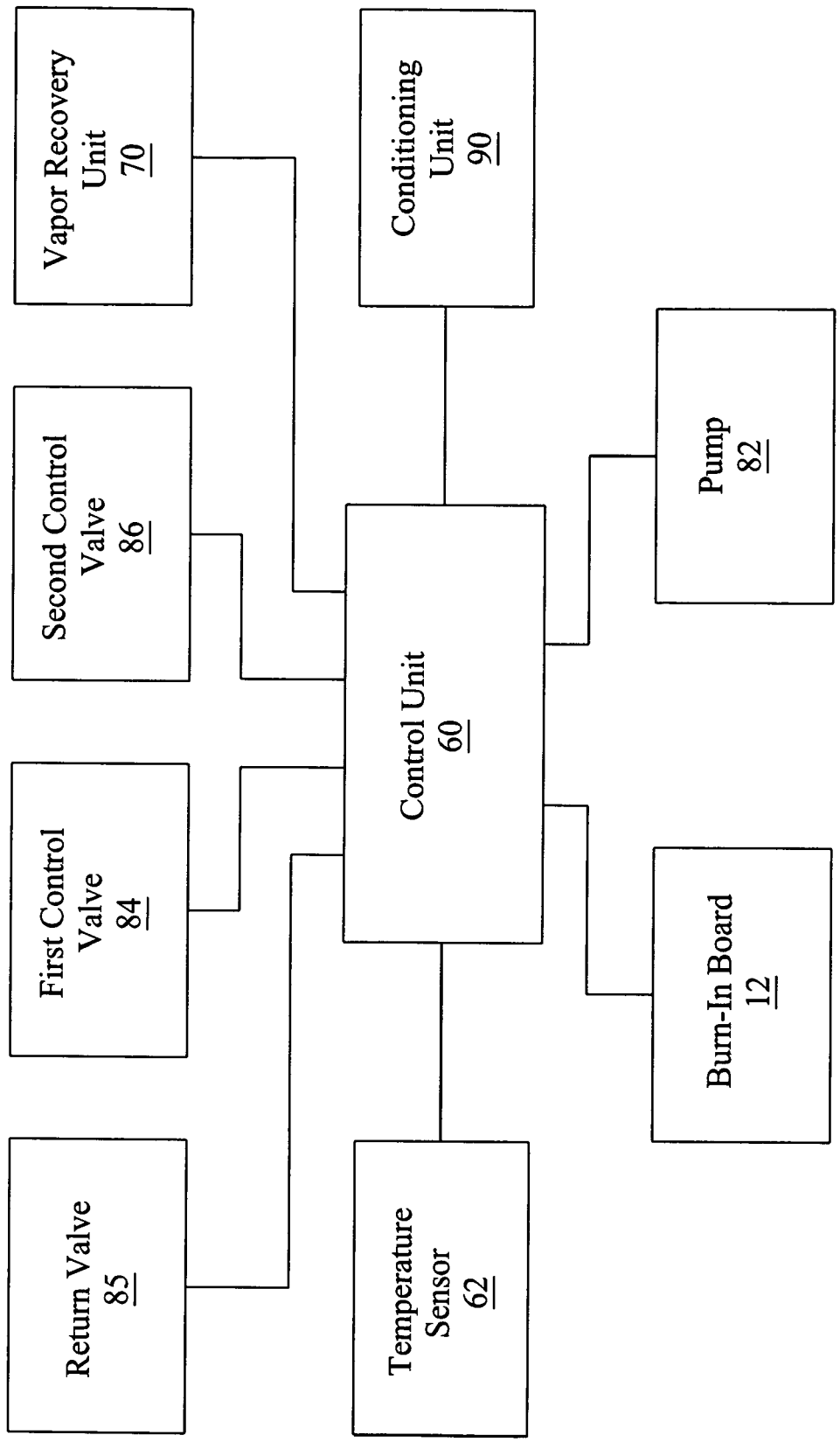
FIG. 2 is a block diagram illustrating the communication connections between the control unit and the related components of the present invention.

Turning now descriptively to the drawings, in which similar reference characters denote similar elements throughout the several views, FIGS. 1 through 18 illustrate a staggered spray nozzle system 10, which comprises a reservoir 80 for storing a volume of fluid, a main pump 82 fluidly connected to the reservoir 80, and a plurality of spray units 40 fluidly connected to the main pump 82. The spray units 40 dispense the fluid upon the surface of the electronic device 18 during burn-in or thermal management thereby maintaining a relatively constant temperature. In the present embodiment of the invention, each of the spray units 40 includes a stationary first portion 50 with a second portion 54 movably positioned within the first portion 50 in a biased manner. When burning in electronic devices 18 without an integrated heat sink that are deeply recessed within the sockets 14 of a burn-in board 12, the fluid pressure to the second portion 54 is preferably increased thereby extending the second portion 54 from the first portion 50 thereby reducing the effective distance from the surface of the electronic device 18.

The invention described herein relates to a stand-alone burn-in system. In other words, the thermal management system, the burn-in boards and chips, and the control system are all packaged into a stand-alone piece of equipment. However, it can be appreciated that the present invention may be embodied in an alternative form that can be described as having a central pump/control station that services multiple satellite burn-in stations serviced by a central reservoir 80, as well as a common fluid distribution system. In addition, the present invention is suitable for other spray cooling applications such as thermal management of one or more electronic devices.

B. Spray Enclosure

Figure 4:
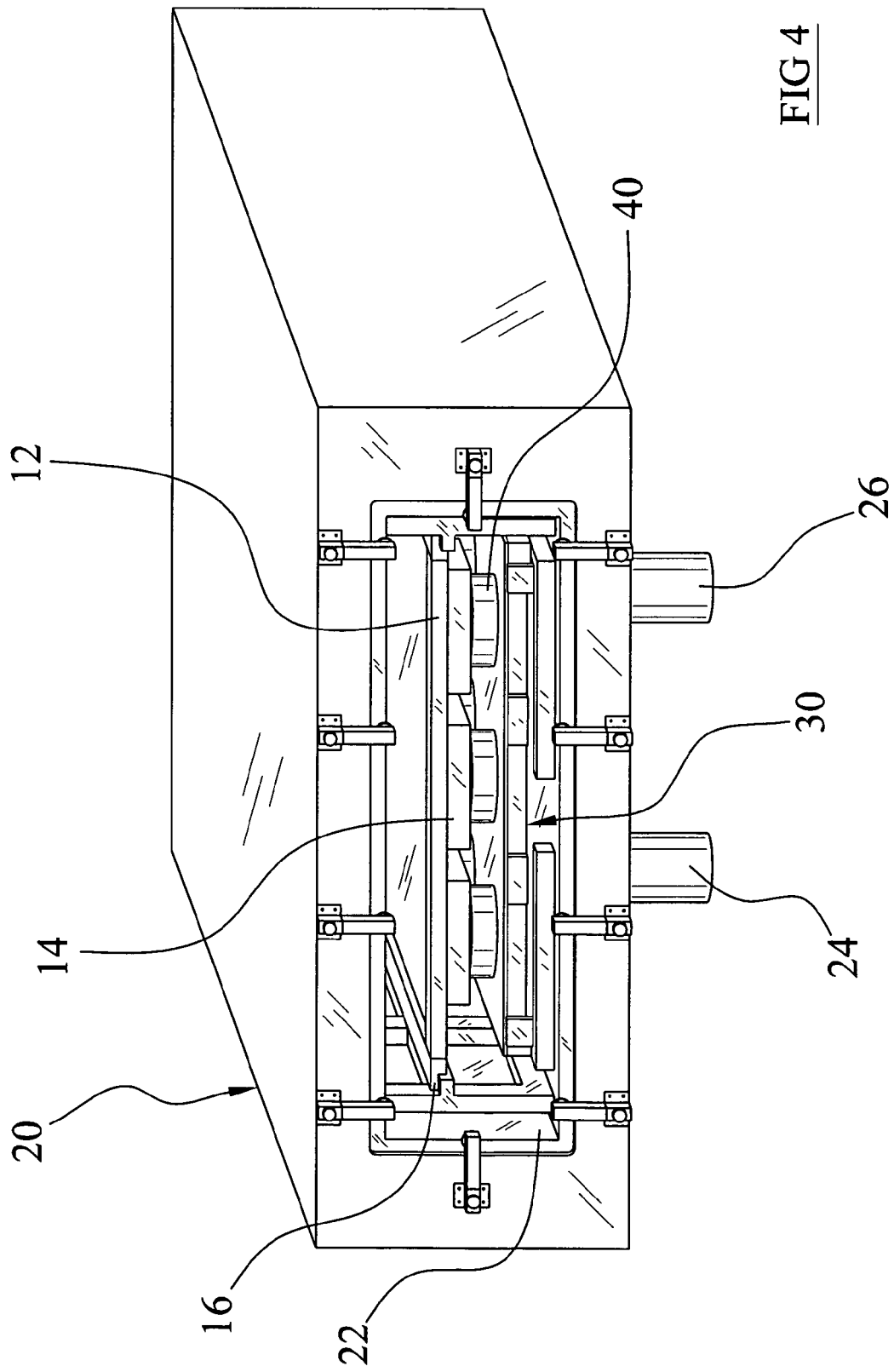
FIG. 4 is an upper perspective view of an exemplary spray enclosure with a burn-in board positioned within.
Figure 5:
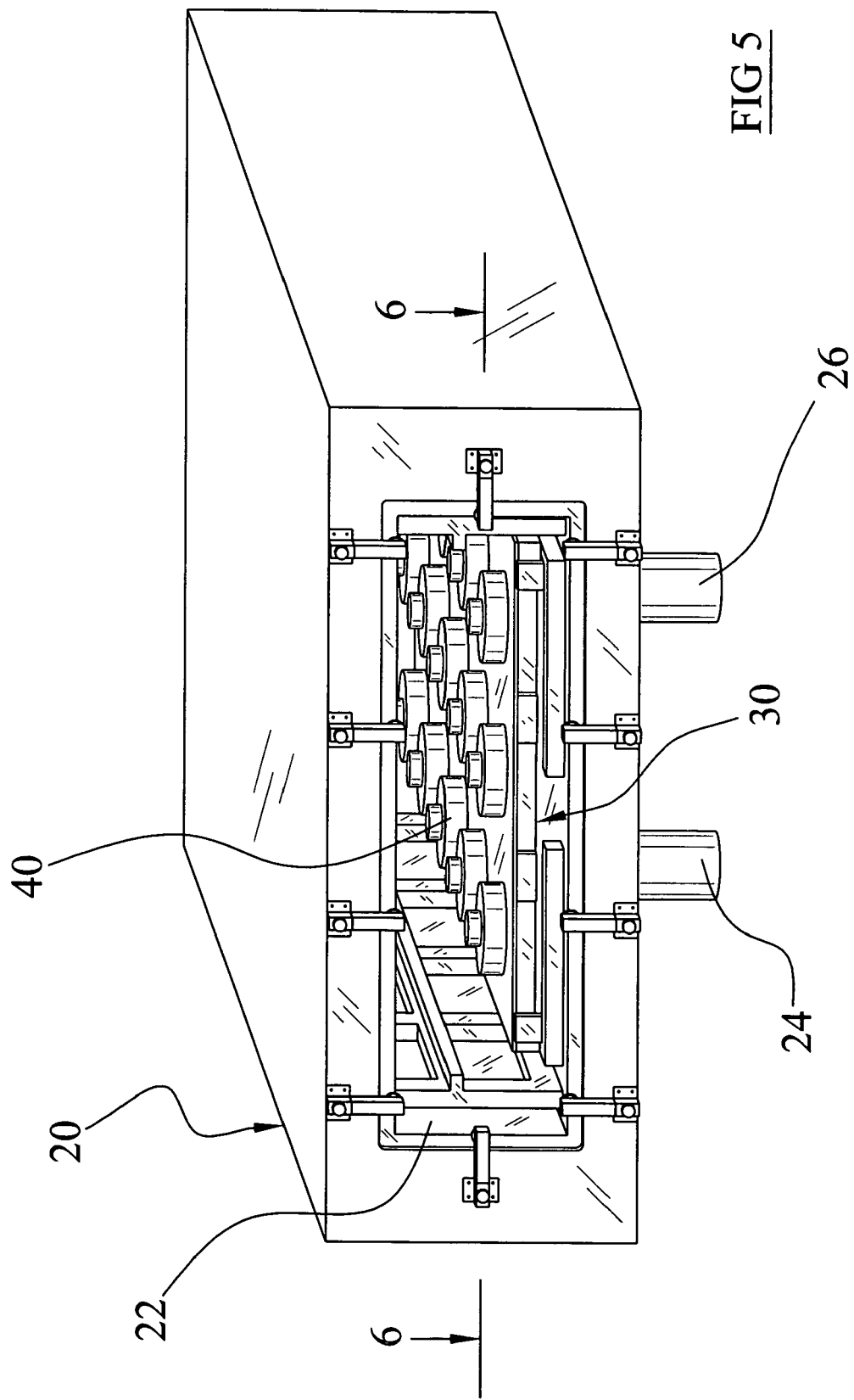
FIG. 5 is an upper perspective view of the exemplary spray enclosure with the burn-in board removed illustrating the spray assembly within the spray enclosure.
Figure 6:
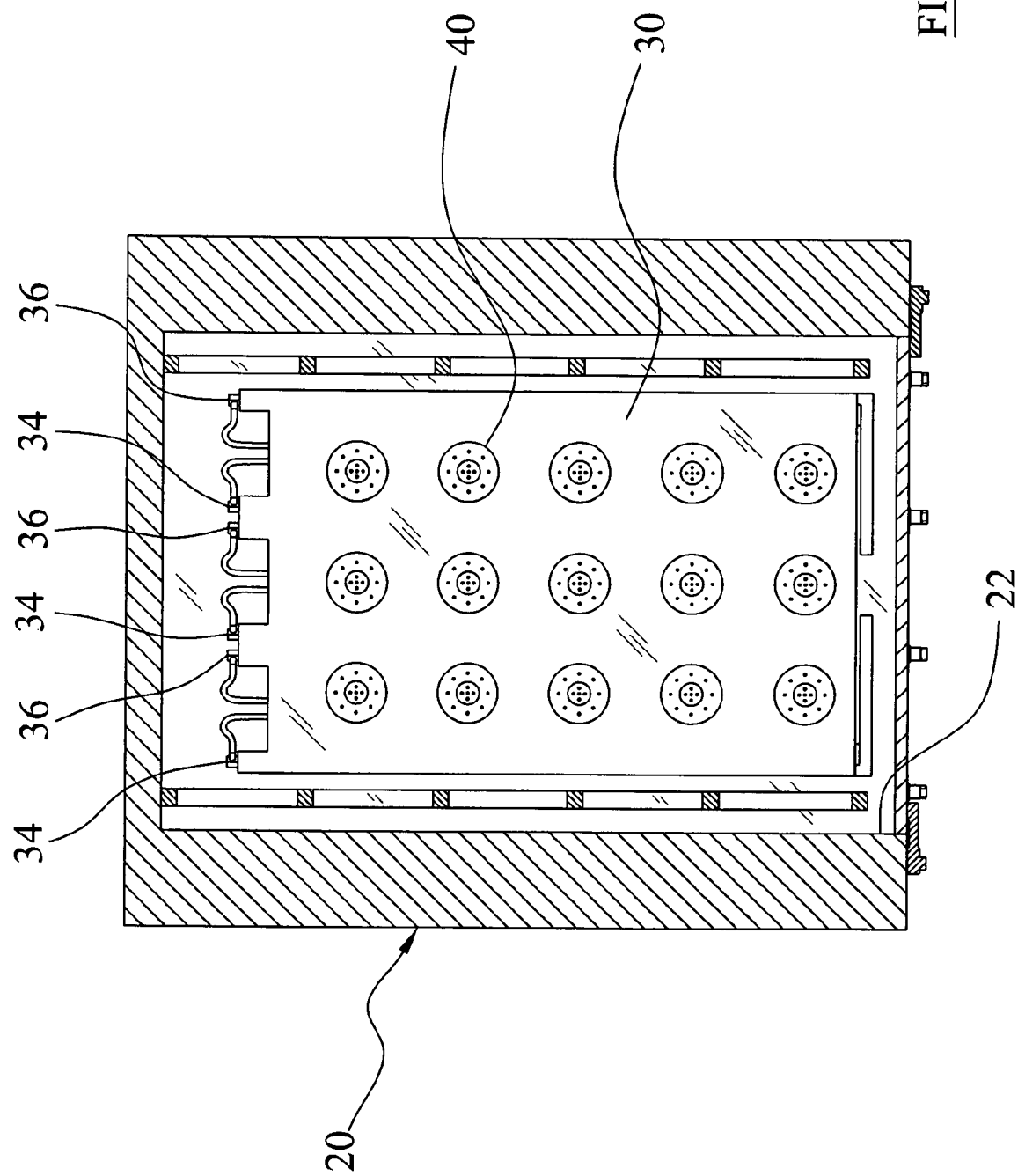
FIG. 6 is a cross sectional view taken along line 6-6 of FIG. 5 illustrating the spray assembly within the exemplary spray enclosure.

FIGS. 4 through 6 illustrate an exemplary spray enclosure 20 having an interior cavity 22 for receiving at least one burn-in board 12. The spray enclosure 20 may be comprised of any structure capable of housing a burn-in board which are commonly utilized within the burn-in industry or other unit not utilized within the burn-in industry. The spray enclosure 20 preferably has an opening and a door for selectively closing and sealing the opening as is conventional with spray enclosures 20 utilized within the burn-in industry. The spray enclosure 20 preferably has a rail structure 16 or other structure for receiving and supporting one or more burn-in boards 12 in a desired position with respect to the corresponding spray assembly 30. It can be appreciated that the spray units 30 and the burn-in boards 12 may be stacked within the interior cavity 22 of the spray enclosure 20 depending upon the total number of burn-in boards 12 to be utilized simultaneously. The present invention may also be configured to receive a self-contained rack unit containing a plurality of arrays of spray assemblies 30 for allowing quick changing of the electronic devices thereby increasing the operational time of the burn-in system.

It can be appreciated that the spray enclosure 20 may have various structures and configurations not illustrated within FIGS. 4 through 6 of the drawings that may be suitable for usage with the present invention. U.S. Pat. No. 5,880,592 provides an exemplary burn-in spray enclosure 20.

As shown in FIGS. 4 and 5 of the drawings, an inlet tube 24 extends into the spray enclosure 20 for providing the fluid to the spray assembly 30 as will be discussed in further detail. As further shown in FIGS. 4 and 5 of the drawings, an outlet tube 26 extends from the spray enclosure 20 returning the fluid recovered from the spray enclosure 20 to the reservoir 80.

U.S. Pat. No. 6,108,201 entitled Fluid Control Apparatus and Method for Spray Cooling to Tilton et al. also describes the usage of spray technology to cool a printed circuit board. Spray thermal management may be performed locally (i.e. where the chip is sprayed directly), globally (i.e. where the chip and surrounding electronics/boards are also sprayed), a combination of locally and globally, or in conjunction with air cooling or other cooling methods. In a spray thermal management system, most if not all of the spray components are contained within the spray chassis such as but not limited to the spray unit, the card cage, valves, pumps, filters, separators and the like.

C. Burn-In Board

Figure 9:
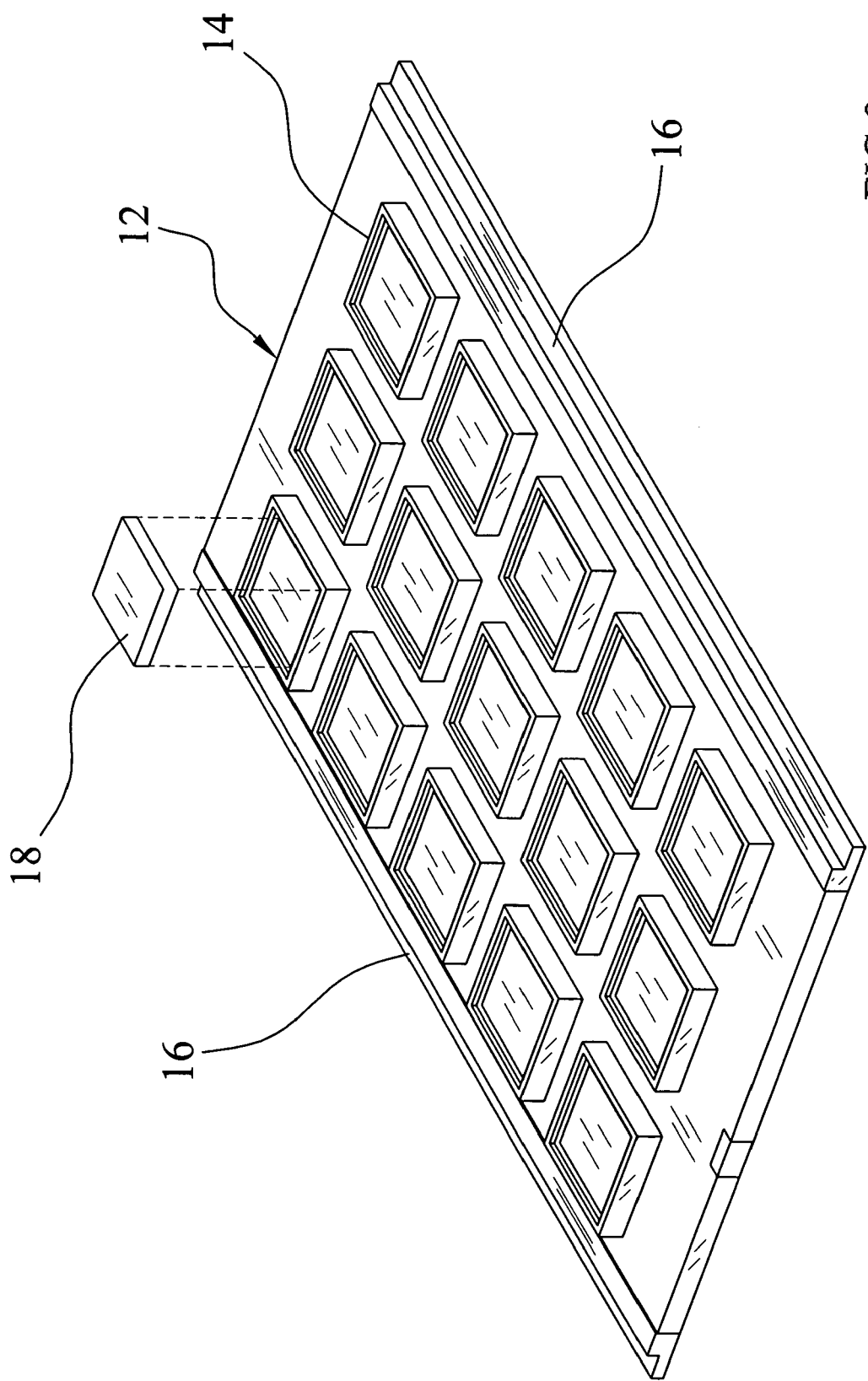
FIG. 9 is an upper perspective view of an exemplary burn-board.

The present invention may utilize various structures and types of burn-in boards 12 that are commonly utilized within the burn-in industry. The burn-in board 12 includes one or more sockets 14 arranged in a desired pattern as shown in FIG. 9 of the drawings. Each of the sockets 14 removably receives, through an opening, an electronic device 18 to be tested during the burn-in phase. The fluid is sprayed from the spay nozzles through this opening to engage a surface of the electronic device 18 contained within the sockets 14 for maintaining the desired temperature of the electronic devices 18 within.

The sockets 14 are electrically connectable to the electronic device 18 inserted within the respective sockets 14. The burn-in board 12 is then electrically coupled to a control unit 60 via a communications port or other structure attached to the burn-in board 12 that controls the test signals sent to each of the electronic devices 18 during the burn-in testing procedure. U.S. Pat. Nos. 6,404,219, 6,181,146 and 5,825,171 illustrate exemplary burn-in devices and burn-in systems which are suitable for usage with the present invention. It can be appreciated that various other burn-in board 12 structures and configurations may be utilized with the present invention.

In addition, a temperature sensor 62 may be attached to each of the sockets 14, directly upon the electronic devices 18 for measuring the temperature of the electronic devices 18 during testing, or may come embedded directly within the chips. Devices for measuring the temperature of electronic devices 18 are commonly utilized within the burn-in industry that may be utilized with the present invention. Examples of suitable temperature sensors 62 include but are not limited to thermocouple, thermopile, electronic devices capable of inferring temperature of the electronic device 18 from the electronic device's power draw, or infrared devices.

D. Spray Assembly

Figure 7:
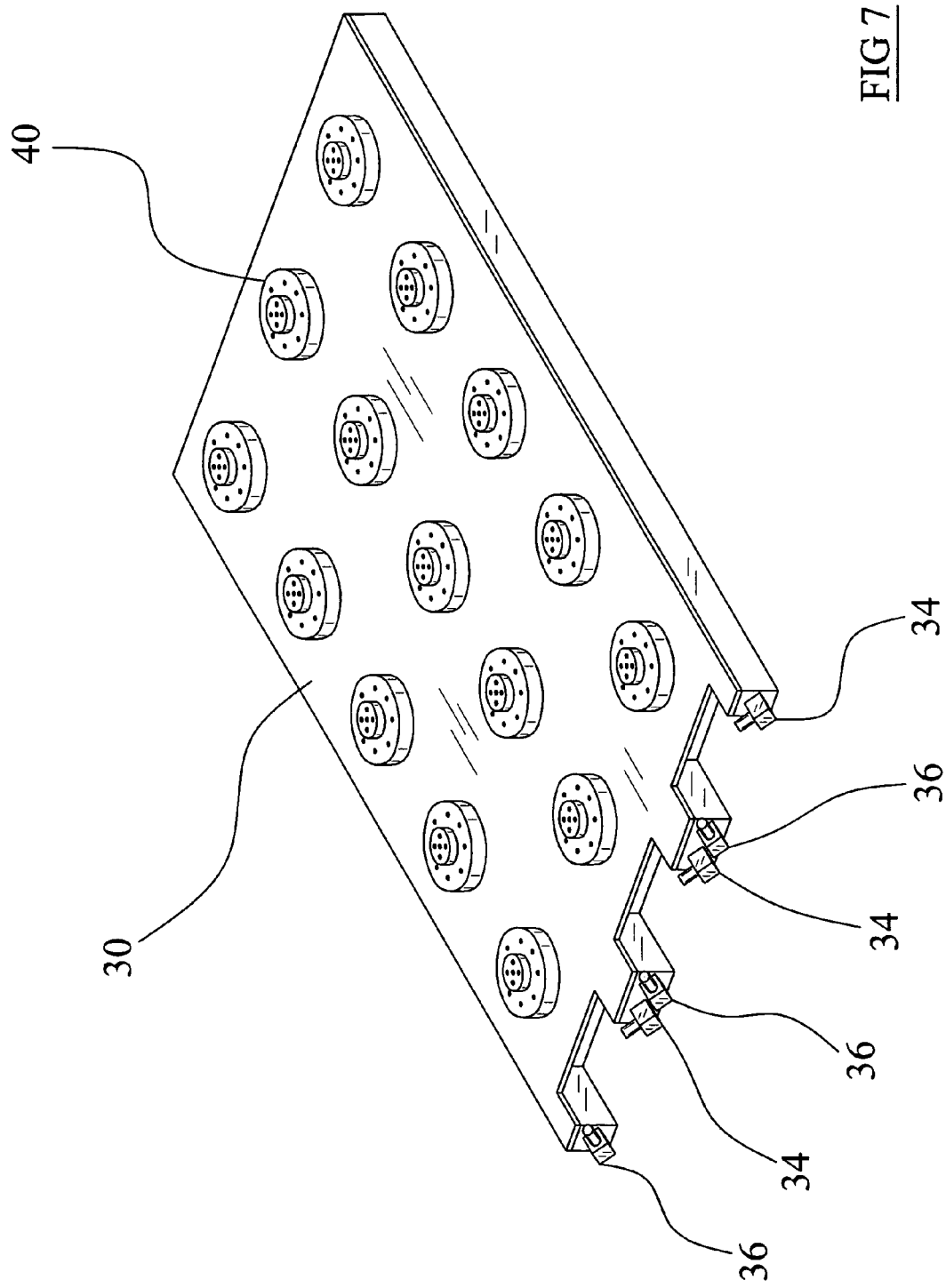
FIG. 7 is an upper perspective view of the upper portion of the spray assembly.
Figure 8:
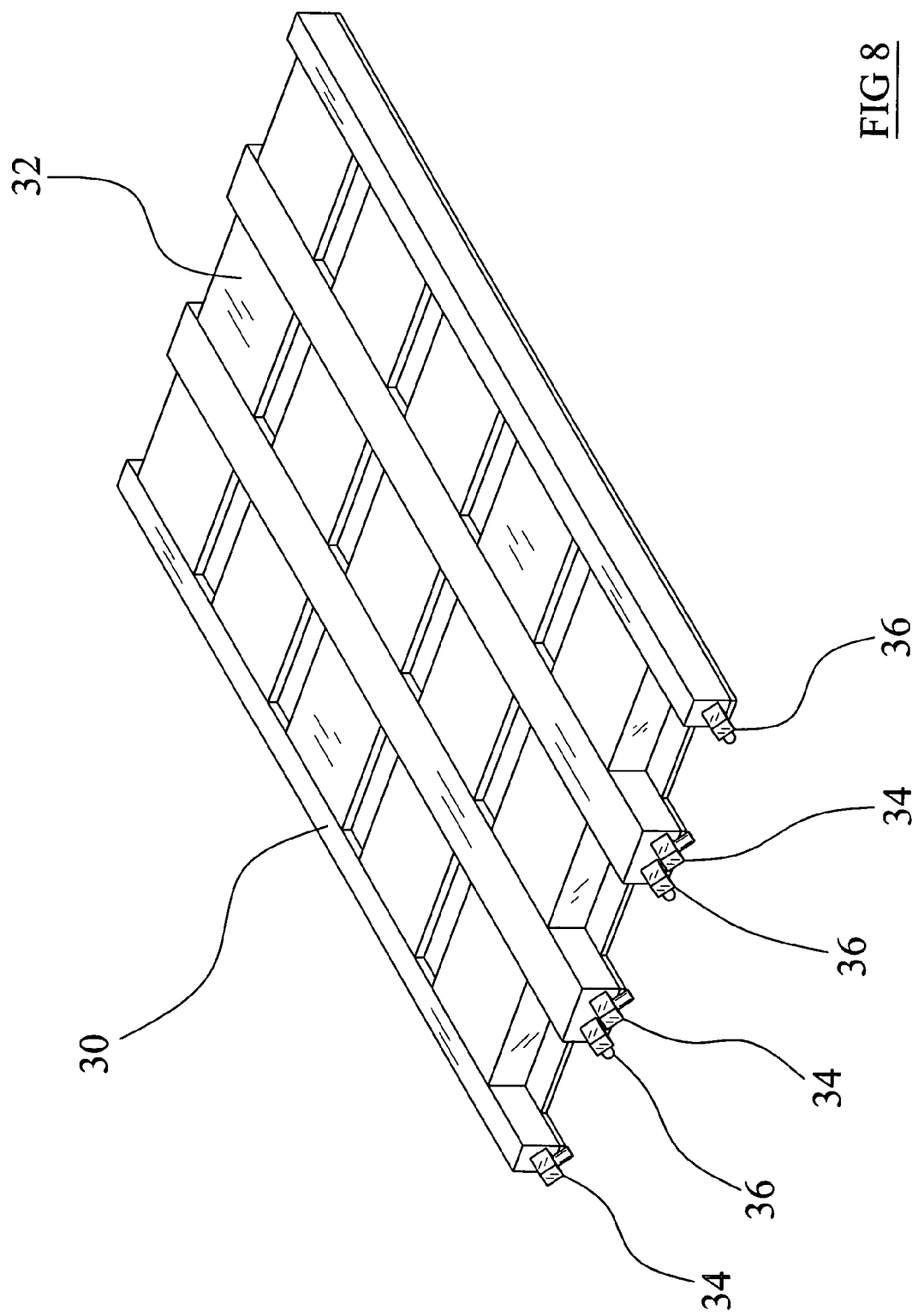
FIG. 8 is an upper perspective view of the lower portion of the spray assembly.

The spray assembly 30 has a housing containing of one or more spray units 40 as illustrated in FIGS. 7 and 8 of the drawings. The spray assembly 30 preferably is comprised of a relatively flat structure, however various other structures may be utilized to construct the spray assembly 30.

Each of the spray units 40 is arranged upon the spray assembly 30 corresponding to a specific socket 14 within the burn-in board 12. There may or may not be a pattern for the plurality of spray units 40 such as but not limited to a row pattern as illustrated in FIGS. 6 and 7, or a staggered pattern.

Each of the spray units 40 includes a housing structure 42 having an interior housing cavity 43 covered by a rear plate 44 as shown in FIGS. 10 through 17 of the drawings. The rear plate 44 may be attached to the housing structure 42 using various fastening devices. The housing structure 42 may have various sizes and shapes other than illustrated in the drawings. A first port 45 and a second port 46 are fluidly connected within the housing structure 42 which fluidly correspond to the first portion 50 and the second portion 54 of the spray units 40 respectively.

Figure 10:
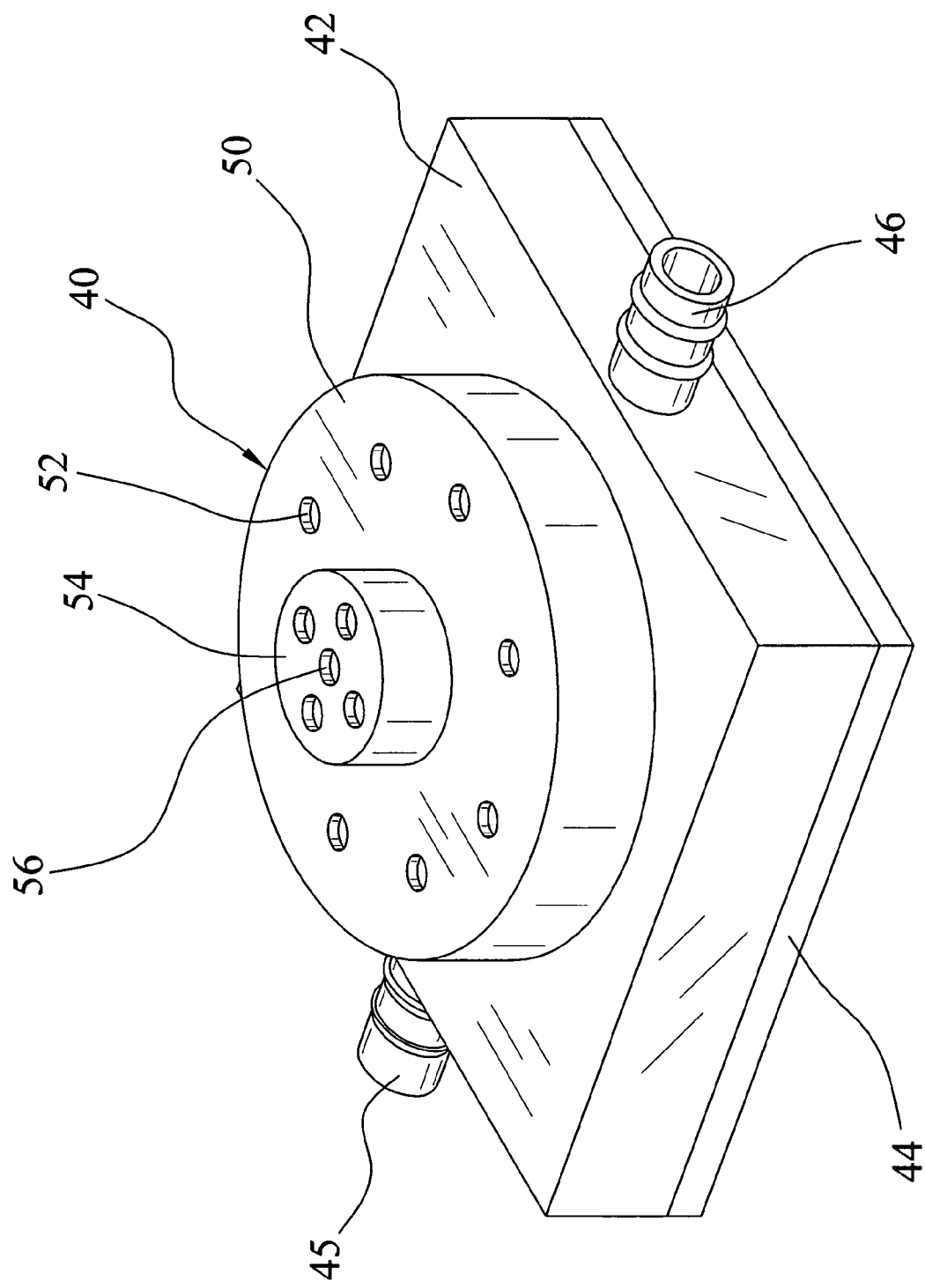
FIG. 10 is an upper perspective view of a spray assembly.
Figure 11:
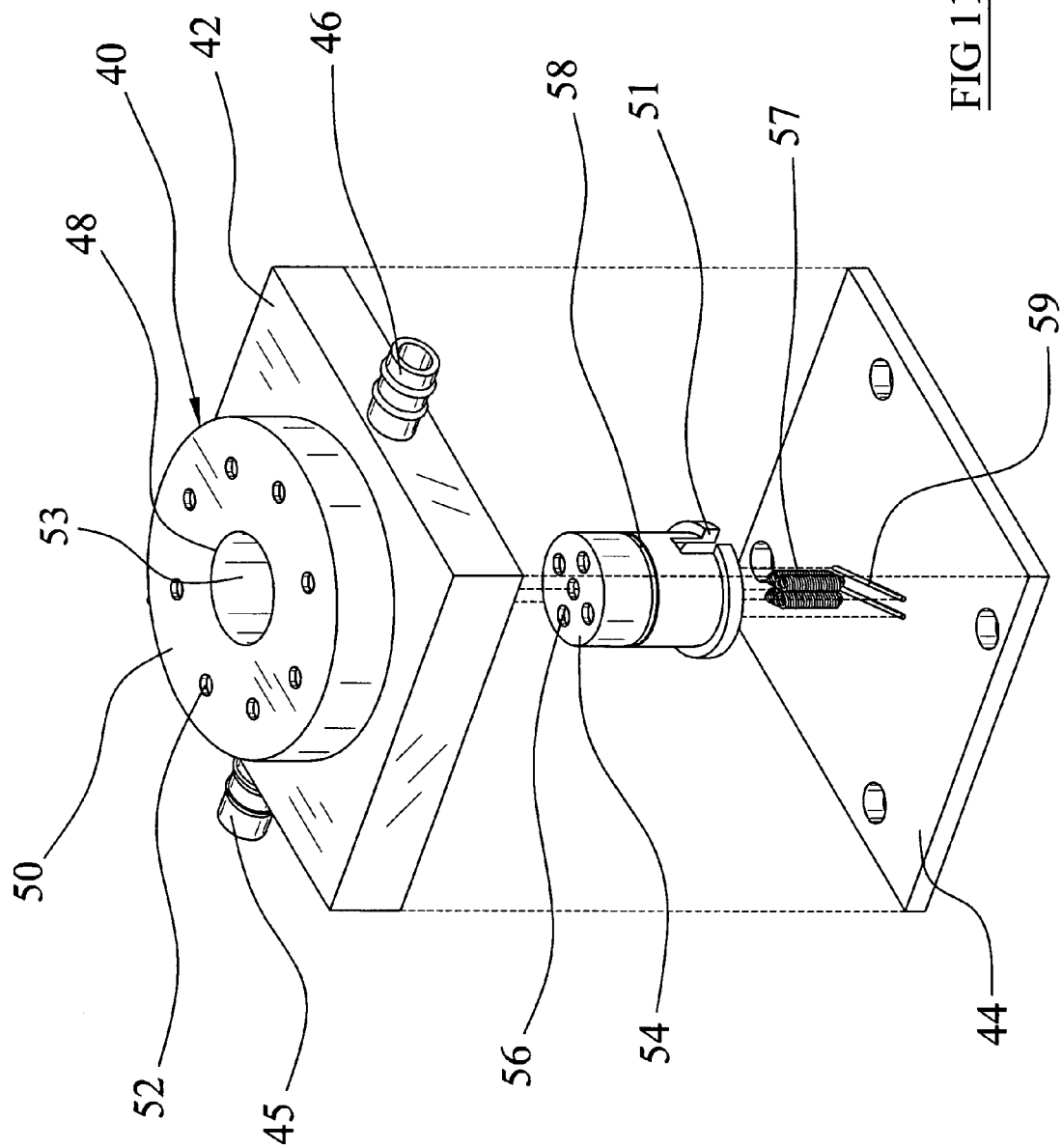
FIG. 11 is an exploded upper perspective view of the spray assembly.
Figure 12:
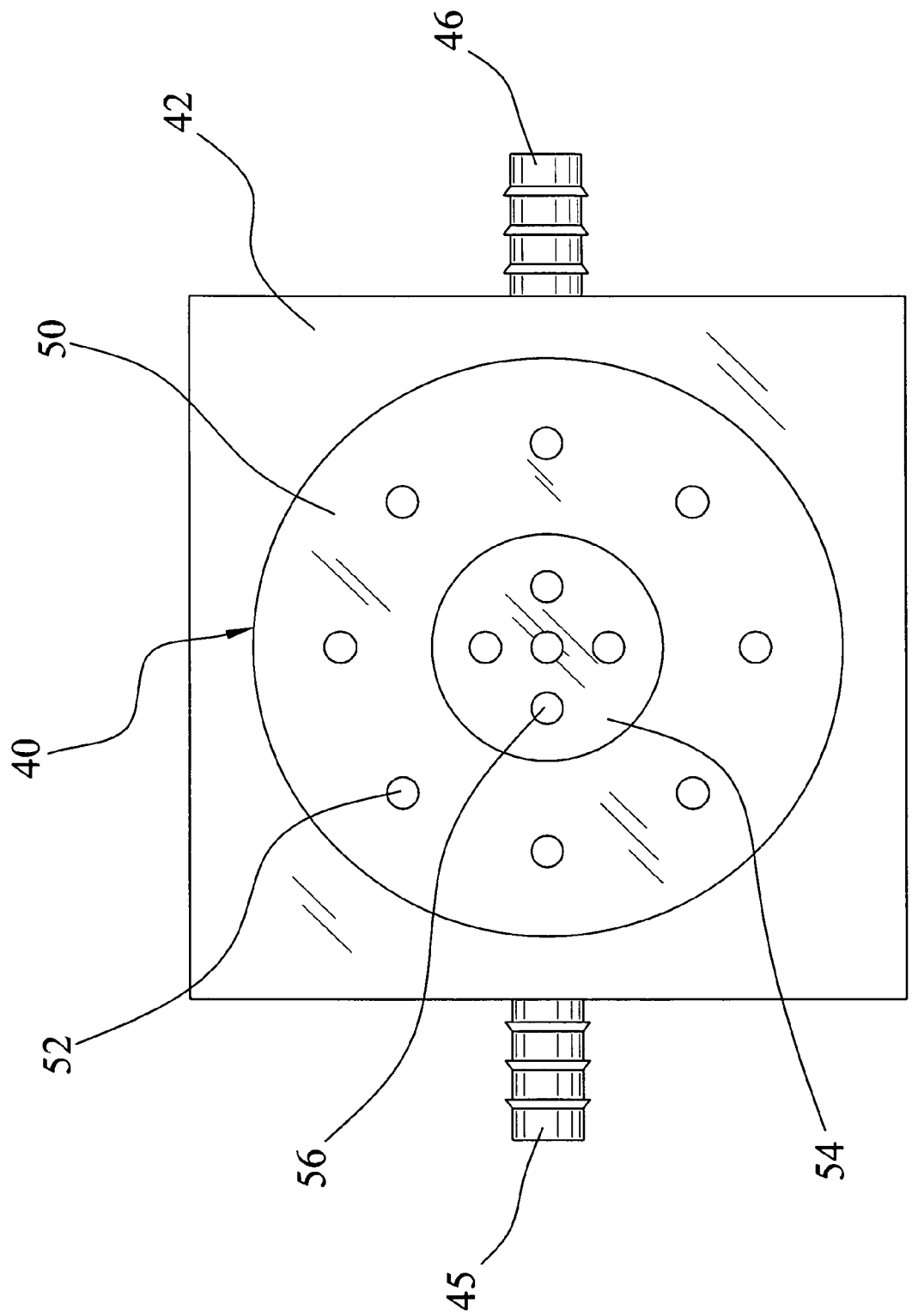
FIG. 12 is a top view of the spray assembly.

As shown in FIGS. 10 through 17 of the drawings and for the present embodiment of the invention, each of the spray units 40 has a first portion 50 and a second portion 54 movably positioned within the first portion 50, though a simpler non-movable nozzle structure may also be utilized with the present invention. FIGS. 10 and 11 illustrate the usage of a circular structure with a partially enclosed upper end. However, the first portion 50 may have various shapes and structures for dispensing the fluid onto the electronic device 18.

The first portion 50 entirely or partially surrounds the second portion 54 as best illustrated in FIG. 10 of the drawings. One or more first orifices 52 extend within the first portion 50 in various patterns. The first orifices 52 may have various characteristics, shapes, sizes, styles, designs, arrangements and densities. The first orifices 52 may be arranged to provide various spray patterns amongst multiple orifices, or various cone angles from each individual orifice, upon the electronic device 18. Cone angles may be of the full cone variety as is known in the art, or of the hollow cone variety as is also known in the art, and may vary from 10° to 60°, but are not limited to varieties, or this angular range. It is desirable to utilize first orifices 52 that provide an adjustable spray pattern depending upon the heat flux of the electronic device 18 being tested. The first orifices 52 dispense the pressurized fluid from within the housing cavity 43 as shown in FIG. 16 of the drawings.

As shown in FIG. 11 of the drawings, a main opening 48 extends into the first portion 50. The main opening 48 has a shape and size similar to the second portion 54 such as but not limited to circular, square, oval, rectangular and the like. The main opening 48 is sufficient in size to allow for the sliding movement of the second portion 54 within the main opening 48.

Figure 13:
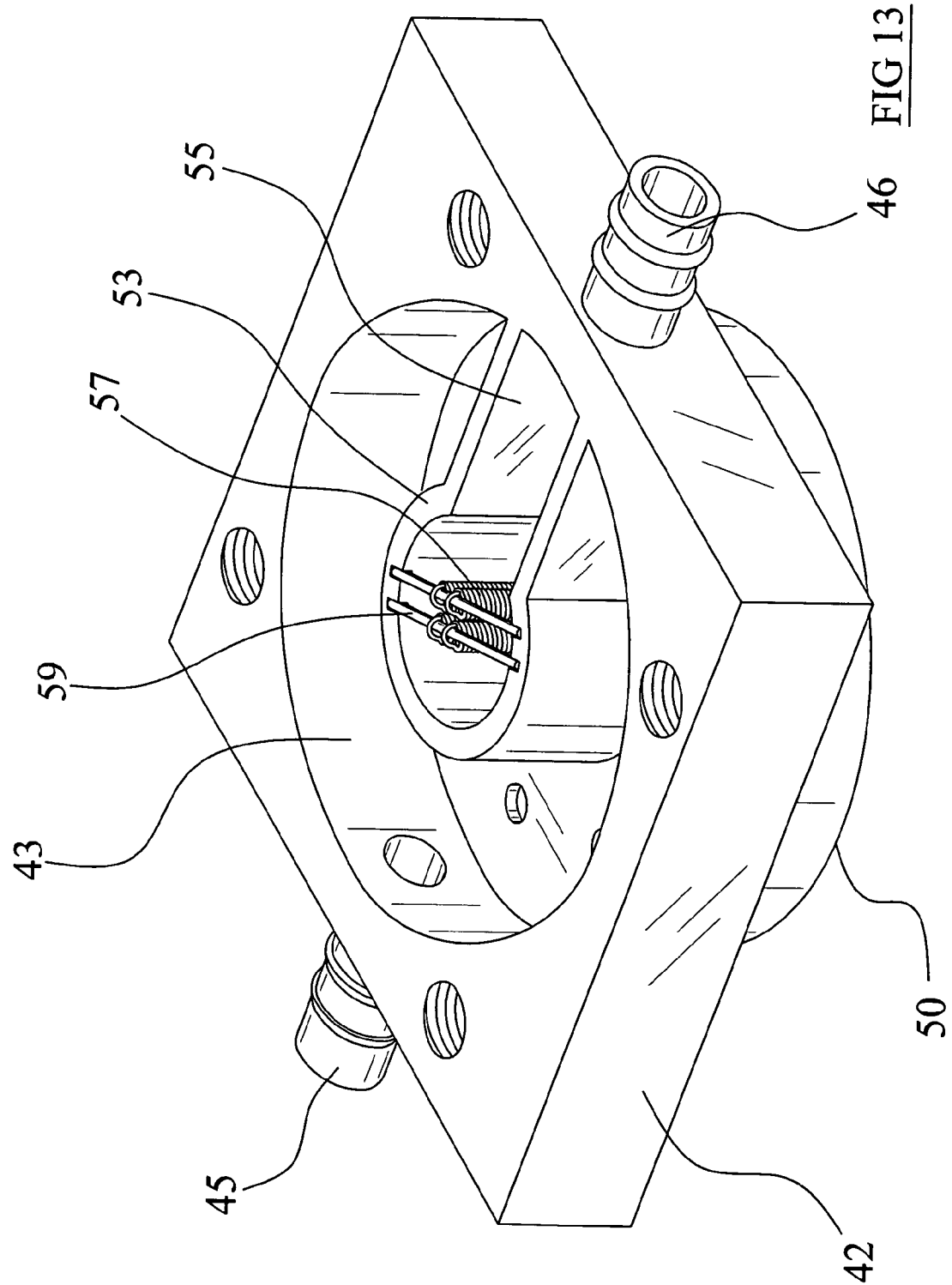
FIG. 13 is an upper perspective view of the spray assembly inverted with the rear plate removed.
Figure 14:
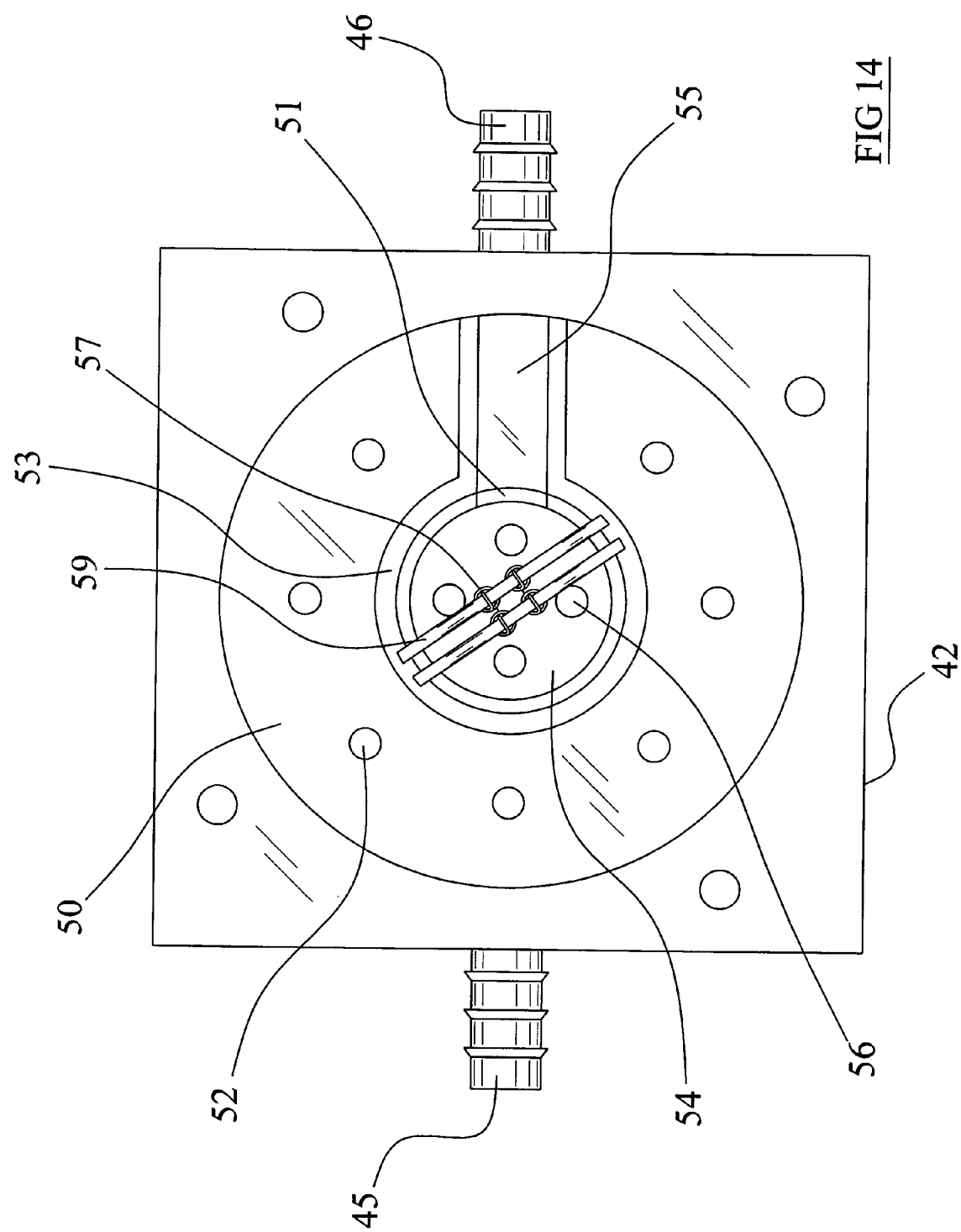
FIG. 14 is a bottom view of the spray assembly with the rear plate removed.
Figure 15:
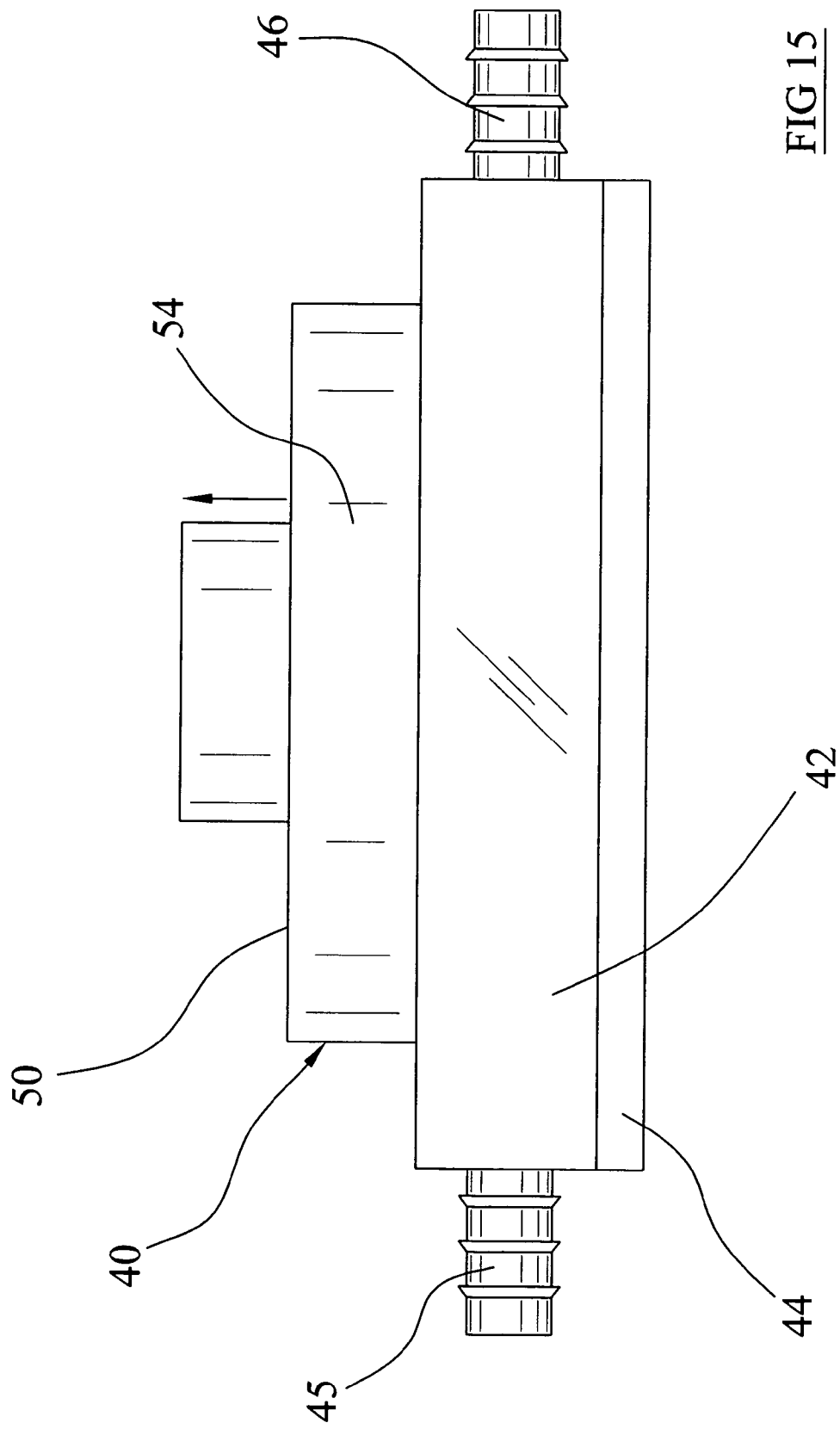
FIG. 15 is a side view of the spray assembly illustrating the movement of the second portion within the first portion.
Figure 16:
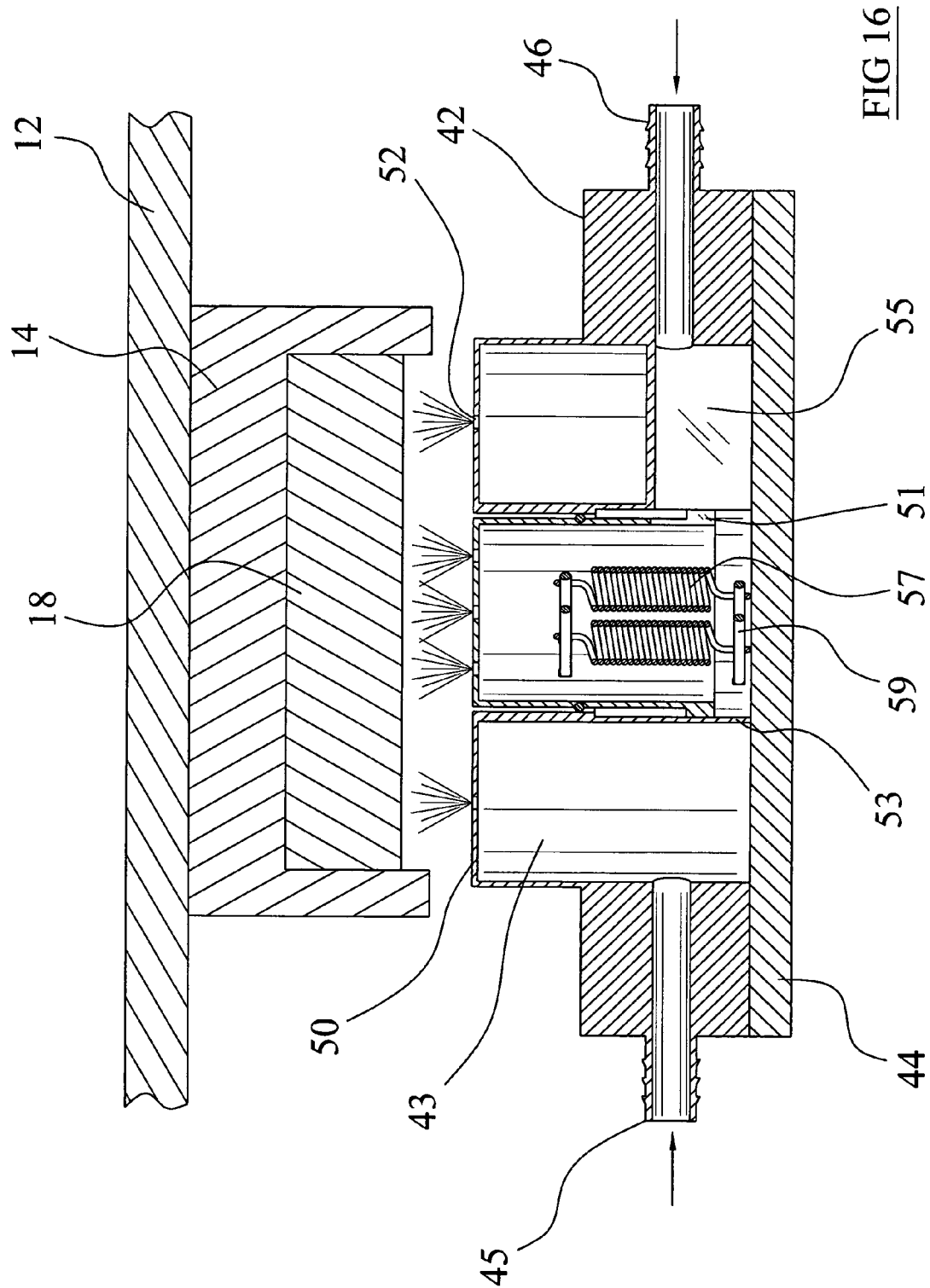
FIG. 16 is a side cutaway view of the spray assembly dispensing fluid upwardly upon the electronic device having a higher profile (e.g. containing an integrated heat sink) within a socket of the burn-in board.
Figure 17:
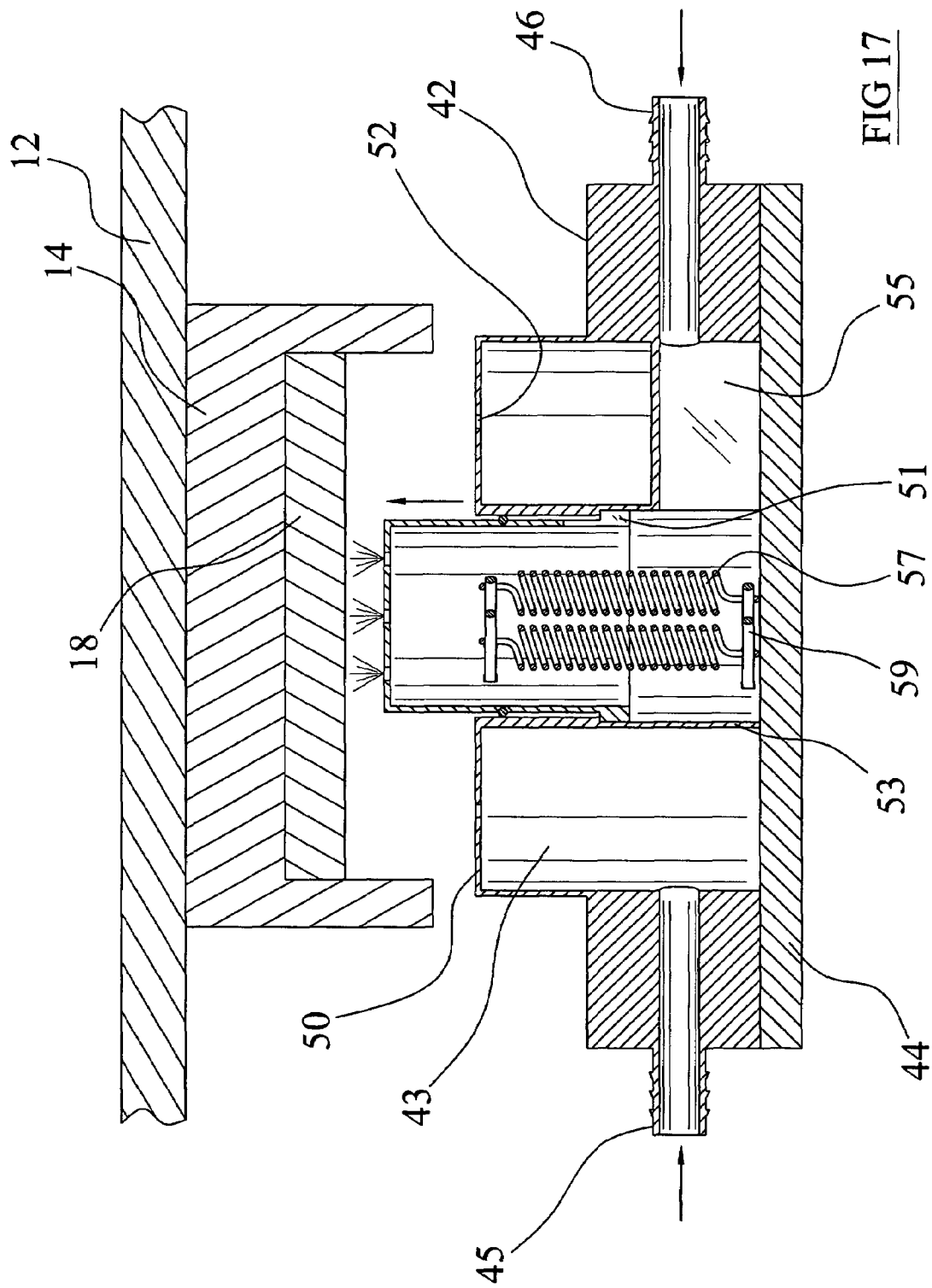
FIG. 17 is a side cutaway view of the spray assembly dispensing fluid upwardly upon the electronic device having a lower profile (e.g. no integrated heat sink) within a socket of the burn-in board with the second portion fully extended from the first portion.

As shown in FIGS. 14, 16 and 17 of the drawings, a tubular portion 53 extends downwardly from an interior surface of the upper end of the first portion 50. The tubular portion 53 preferably surrounds the main opening 48 within the first portion 50 and extends downwardly a finite distance for slidably receiving the second portion 54. A channel 55 fluidly extends from the second port 46 to the tubular portion 53 in a sealed manner to provide pressurized fluid to the second portion 54 independently of the first portion 50 as best illustrated in FIG. 13 of the drawings. It can be appreciated that a single channel may feed both the first portion 50 and the second portion 54.

As shown in FIG. 11 of the drawings, the second portion 54 is comprised of a tubular structure with one or more second orifices 56 within the upper end thereof. The second orifices 56 may have various characteristics, shapes, sizes, styles, designs, arrangements, patterns and densities. The second portion 54 is formed to slidably extend within the main opening 48 and the tubular portion 53 as best illustrated in FIGS. 16 and 17 of the drawings. At least one seal member 58 is positioned within the second portion 54 for sealing the second portion 54 within the tubular portion 53 as best illustrated in FIG. 11 of the drawings. A longitudinal cutout 51 preferably extends into the lower end of the first portion 50 which movably fits about the channel 55 thereby allowing entry of the fluid from the channel 55 into the second portion 54.

For a given cone type (full cone or hollow), each of the first orifices 52 and second orifices 56 may have static spray cone angles or dynamic spray cone angles. Dynamic spray cone angles may be utilized dependent upon changing thermal management requirements for the electronic device 18. For example, if it is desirable to reduce the cooling of the electronic device 18, one or more of the orifices 52, 56 may be adjusted to reduce the surface area that is sprayed with the fluid by adjusting the spray cone angles in response to temperature feedback. Conversely, if it is desirable to increase the cooling of the electronic device 18, one or more of the orifices 52, 56 may be adjusted to increase the surface area that is sprayed with the fluid by adjusting the spray cone angles in response to temperature feedback.

The second portion 54 is downwardly biased within the tubular portion 53 by a biasing device which may be comprised of various biasing structures such as but not limited to springs 57. The biasing device is preferably comprised of one or more springs 57 attached between the tubular portion 53 and the second portion 54 as illustrated in FIGS. 16 and 17 of the drawings. One or more support members 59 are attached to a lower end of the tubular portion 53 and within the second portion 54 wherein the springs 57 are connected between thereof.

When the fluid pressure within the channel 55 and the second portion 54 is increased sufficiently to overcome the biasing force of the springs 57, the second portion 54 is then extended outwardly from the first portion 50 as illustrated in FIG. 17 of the drawings. A lower flanged portion extending from the second portion 54 preferably engages a lip within the tubular portion 53 thereby preventing the second portion 54 from overextending from within the first portion 50.

When the fluid pressure within the channel 55 and the second portion 54 is not sufficient to overcome the biasing force of the springs 57, the second portion 54 is then retained downwardly within the first portion 50 with the upper ends of the first portion 50 and the second portion 54 substantially level to one another as illustrated in FIG. 16 of the drawings. It can be appreciated that varying fluid pressure within the channel 55 and the second portion 54 will extend the second portion 54 at varying distances.

The spray assembly 30 preferably includes a first inlet port 34 that is fluidly connected to the first portion 50 of the spray units 40 and a second inlet port 36 that is fluidly connected to the second portion 54 of the spray units 40. A first valve 84 preferably controls the fluid flow from the inlet tube 24 to the first inlet port 34. The first port 45 within the spray units 40 receives the fluid flow from the first inlet port 34 thereby providing the pressurized fluid to the housing cavity 43 of the spray units 40 for dispensing from the first portion 50 of the spray units 40.

A second valve 86 preferably controls the fluid flow from the inlet tube 24 to the second inlet port 36. The second port 46 within the spray units 40 receives the fluid flow from the second inlet port 36 for dispensing through the second orifices 56 within the second portion 54.

E. Dynamic Spray Control

Figure 18:
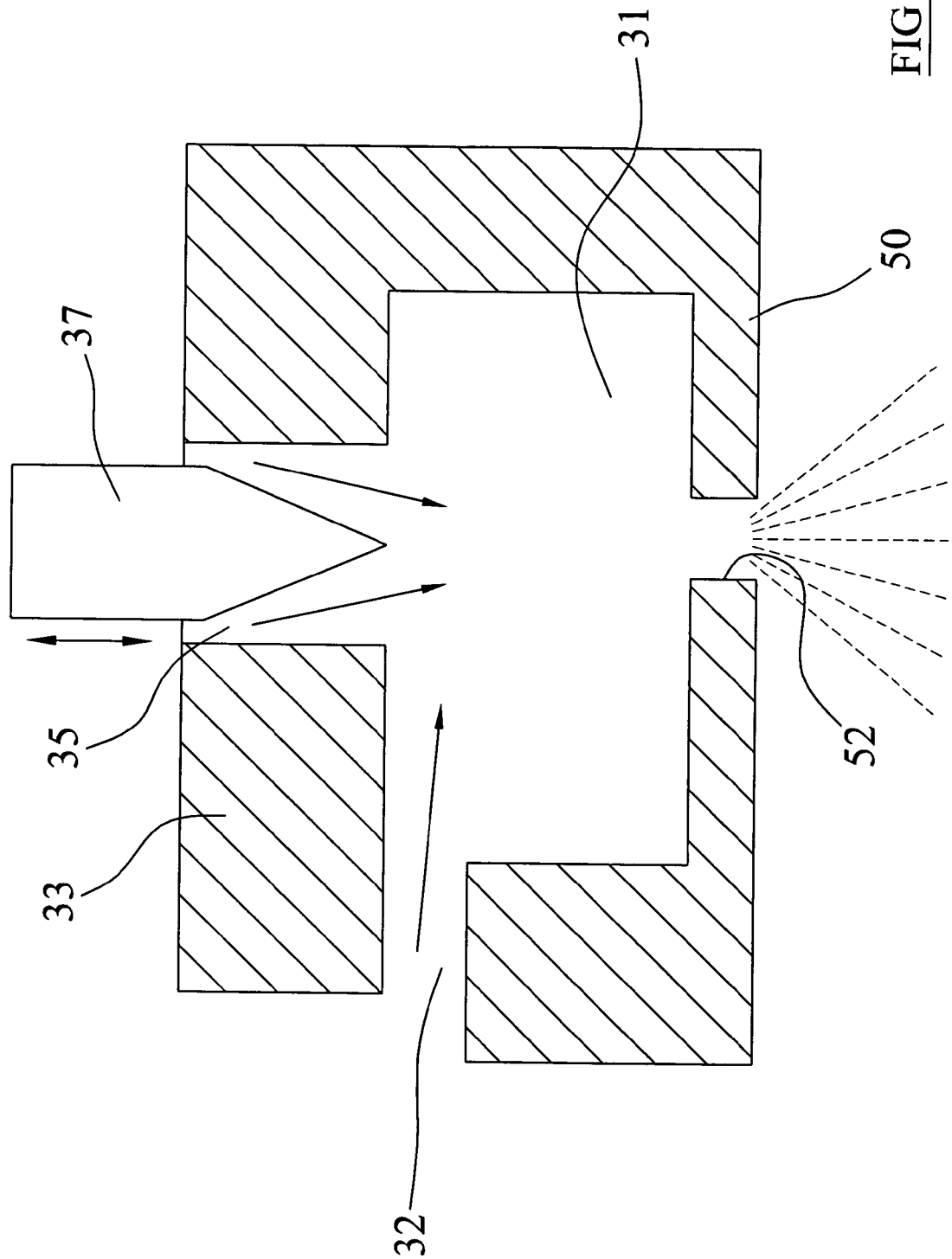
FIG. 18 is a side cutaway view of a dynamic spray control for the spray units.

FIG. 18 of the drawings illustrates an exemplary dynamic spray control for the spray units 40. The dynamic spray control may be used for one or more of the orifices 52, 56. As shown in FIG. 18, a chamber 31 is provided that is fluidly connected to the first orifice 52. One or more feed ports 32 are fluidly connected to the chamber 31 for providing a cross fluid flow into the chamber 31 with respect to the direction of spray from the first orifice 52. A center jet 35 extends within an inlet plate 33 partially surrounding the chamber 31 opposite of the first orifice 52. The inlet plate 33 may have various thickness, however it is preferably to maintain the thickness of the inlet plate 33 between 0.005-0.20 inches. A thicker inlet place 33 provides increased control over the fluid flow.

A plunger 37 is positioned within the center jet 35 that has a tapered end portion as illustrated in FIG. 18 of the drawings. The plunger 37 controls the amount of fluid that flows through the center jet 35. As the fluid flows into the chamber from the center jet 35, the fluid is combined with fluid flowing into the chamber transversely from one or more feed ports 32 creating a swirling effect within the chamber 31. As the plunger 37 is retracted from the center jet 35, an increased flow rate of the fluid is provided to the chamber 31 thereby reducing the amount of swirling of the fluid within the chamber 31 that occurs because of the feed port 32. The center jet 35 and the plunger 37 may be sized such that when the plunger 37 is fully retracted from the center jet 35, a relatively straight jet of fluid passes through the first orifice 52 instead of an atomized spray.

Various technologies may be utilized to control the position of the plunger 37 within the center jet 35 such as but not limited to digital stepper motors, linear actuators, magnetostrictive actuators or mechanical devices. In addition, each plunger 37 may be controlled individually or in a group by using a common mechanical or electrical structure by the control unit 60. The plunger 37 may be positioned within the feed port 32. In addition, the inlet plate 33 may be moved with respect to the plunger 37 in a stationary position to create a similar effect. A piezo-crystal or magnetostrictive material positioned between the inlet plate 33 and the walls of the chamber 31 may be utilized to manipulate the position of the inlet plate 33. Various other devices may be utilized to control the flow of fluid into the chamber 31 and thereby control the characteristics of the fluid spray dispersed from the first orifice 52.

F. Fluid Distribution System

The reservoir 80 is comprised of a container structure capable of retaining a desired volume of fluid. The reservoir 80 may have various shapes, sizes and structures which are commonly utilized to construct a reservoir 80. The fluid utilized within the present invention is preferably comprised of a dielectric fluid such as but not limited to hydrofluoroether (HFE). However, the fluid utilized may be comprised of a non-dielectric such as but not limited to water.

The reservoir 80 may include a thermal conditioning unit 90 for increasing or decreasing the temperature of the fluid within the reservoir 80 to a desired temperature to be sprayed upon the electronic devices 18 during the burn-in process. The thermal conditioning unit 90 may be comprised of a combination heater unit and cooling unit. A heat exchanger may be utilized to increase the temperature of the fluid within the reservoir 80 by exchanging the heat from the fluid returning from the spray enclosure 20 after spraying upon the electronic devices 18. An inline heater/cooler may also be utilized to thermally condition the fluid prior to or after spraying from the nozzles.

A main pump 82 is fluidly connected to the reservoir 80 for drawing the dielectric fluid from within the reservoir 80. The fluid pressure within the fluid distribution system may be maintained by operation of the main pump 82 and/or a return valve 85 which allows for the return of fluid to the reservoir 80 to lower the fluid pressure as shown in FIG. 1 of the drawings. Various other pressure regulating devices may be utilized to control the fluid pressure on the pressurized side of the pump. The main pump 82 is fluidly connected to the first valve 84 and the second valve 86 as further illustrated in FIG. 1 of the drawings thereby providing pressurized fluid to the spray units 40 at the desired pressure.

As shown in FIG. 1 of the drawings, a fluid collector 28 is positioned within the spray enclosure 20 for collecting the fluid after being sprayed upon the electronic devices 18. The fluid collector 28 may be comprised of various collecting devices such as but not limited to a pan structure. The fluid collector 28 is fluidly connected to the reservoir 80 for returning the used fluid to the reservoir 80. A filter device may be positioned within the fluid collector 28 or the reservoir 80 for filtering the fluid after being sprayed upon the electronic devices 18 for removing undesirable particulate materials and chemicals which might interfere with the operation of the spray units 40.

A vapor recovery unit 70 may be fluidly connected to or within the spray enclosure 20 for collecting and condensing fluid that has undergone a phase change to vapor. The vapor recovery unit 70 may be comprised of condensing coils and similar other devices capable of condensing vapor. The vapor recovery unit 70 may be utilized during and after the burn-in process.

G. Control Unit

The control unit 60 may be comprised of various electronic devices capable of communicating with and controlling the burn-in board 12, the thermal conditioning unit 90, the main pump 82, the first valve 84, the second valve 86, the return valve 85 and the vapor recovery unit 70. The control unit 60 may be comprised of a computer or other electronic device capable of receiving and storing commands.

The control unit 60 may communicate with the external electrical devices such as but not limited to electrically or via communications signal. The control unit 60 may be programmed to operate the external devices at various operating levels such as but not limited to controlling the temperature of the fluid within the reservoir 80, controlling the fluid pressure and flow rate emitted by the main pump 82, controlling the spray pattern and flow of the orifices 52, 56, and controlling the flow of fluid to the spray unit 40. It can be appreciated that more than one control unit 60 may be utilized to control one or more of the components of the present invention.

H. Operation

In use, the electronic devices 18 are properly positioned within the sockets 14 of the burn-board 12. The burn-in board 12 is then positioned within the spray enclosure 20 with the surface of the electronic devices 18 facing substantially downwardly toward the upper end of the corresponding spray units 40. The dielectric fluid within the reservoir 80 is heated to a desired temperature for cooling or heating the electronic devices 18 with or without using a conditioning unit 90. The main pump 82 and valves 84, 86 may be utilized to achieve and maintain the target junction temperature even though the fluid temperature may not be the desired temperature. The main pump 82 is operated to provide the pressurized fluid to the spray assembly 30.

If the electronic devices 18 being burned in have a relatively high profile (e.g. electronic devices 18 with integrated heat sinks which have a lower heat flux thereby requiring less fluid flow for cooling purposes), then both the first valve 84 and the second valve 86 are opened to provide fluid to the first portion 50 and the second portion 54 at a substantially constant pressure. As further shown in FIG. 16 of the drawings, fluid is sprayed from both the first orifices 52 and the second orifices 56 without the second portion 54 elevated with respect to the first portion 50.

If the electronic devices 18 being burned-in have a low profile within the socket as illustrated in FIG. 17 of the drawings (e.g. electronic devices 18 without integrated heat sinks which have a higher heat flux thereby requiring increased fluid flow for cooling purposes), then the first valve 84 is closed and the second valve 86 is opened with increased fluid pressure being supplied to the second portion 54 thereby extending the second portion 54 upwardly from the first portion 50 near the electronic device 18.

It is desirable to decrease the distance D between the distal end of the second portion 54 and the surface of the electronic device 18 when high heat flux conditions exist requiring additional cooling. Conversely, it is desirable to increase the distance D between the distal end of the second portion 54 and the surface of the electronic device 18 when low heat flux conditions exist requiring less cooling.

Figure 3:
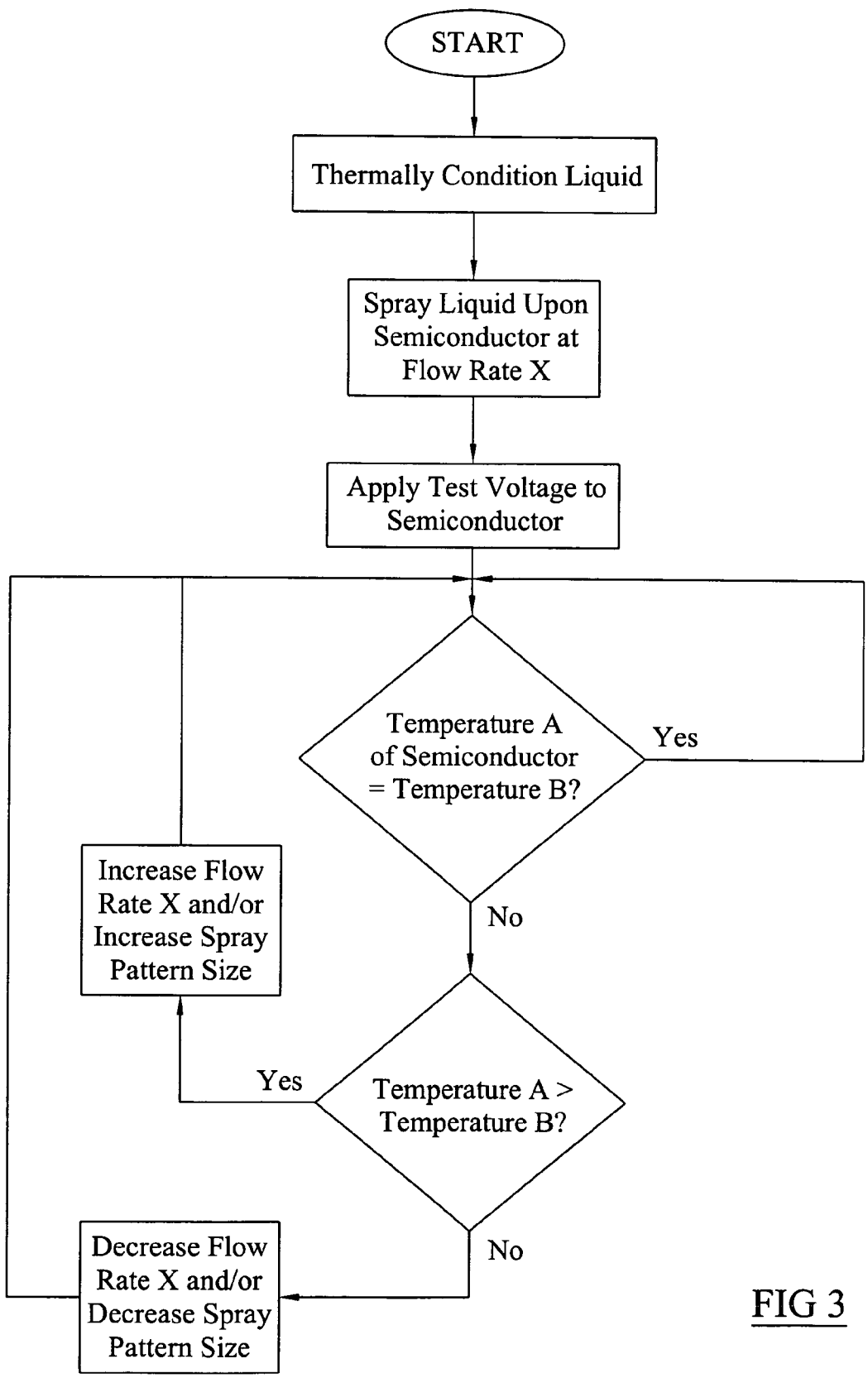
FIG. 3 is a flowchart illustrating the overall operation of the present invention.

As the fluid or fluid is sprayed upon the electronic device 18, the control unit 60 applies the desired voltage to the electronic devices 18 for burn-in testing purposes thereby increasing or lowering the temperature of the electronic device 18. If the temperature A of the electronic device 18 rises above a desired temperature B (e.g. 100° Celsius), then the flow rate X of the fluid is increased to the spray units 40 as shown in FIG. 3 of the drawings. In addition to or independent of increasing the flow rate X, the spray pattern size emitted from one or more of the orifices 52, 56 may be increased to engage an increased surface of the electronic device 18 of the electronic device thereby increasing the cooling of the electronic device 18. Instead of increasing the size of the spray pattern for increasing the cooling of the electronic device, the spray pattern may also be directed to and focused upon a specific area of the electronic device 18 that has a high heat flux compared to other areas of the electronic device 18.

If the temperature A of the electronic device 18 is lowered below a desired temperature B, then the flow rate X of the fluid is decreased to the spray units 40 as shown in FIG. 3 of the drawings. In addition to or independent of decreasing the flow rate X, the spray pattern size emitted from one or more of the orifices 52, 56 may be decreased to engage an reduced surface of the electronic device 18 thereby reducing the cooling of the electronic device 18. Instead of decreasing the size of the spray pattern for decreasing the cooling of the electronic device, the spray pattern may also be directed away from a specific area of the electronic device 18 that has a high heat flux compared to other areas of the electronic device 18. In addition, the spray pattern may be increased in size thereby reducing the spray engaging high heat flux areas of the electronic device 18.

If the temperature A of the electronic device 18 is approximately equal to a desired temperature B, then the flow rate X of the fluid is maintained to the spray units 40 as shown in FIG. 3 of the drawings. In addition, the spray pattern size is preferably maintained relatively constant for each of the orifices 52, 56 where the temperature A of the electronic device 18 is approximately equal to the desired temperature B.

In order to control the temperature A of the electronic device 18, the power level may also be increased or lowered independently or in conjunction with the control of the fluid flow rate. The AC and DC power levels may be adjusted to manipulate the electronic device's temperature.

Various methods of thermal management may be employed for the electronic devices 18. For adequately low heat fluxes, it may be appropriate to cool the electronic devices 18 through purely forced convection (i.e. no effective evaporation of the coolant occurs). For intermediate heat fluxes, it may be appropriate to utilize a combination of forced convection and phase change heat transfer (i.e. the latter method resulting in evaporation of the coolant). For the highest level of heat fluxes, it may be appropriate to optimize purely on phase change heat transfer. For optimization on an approach that is dominated by phase change, it is critical to have a system design and method of operation that allows the maintenance of a thin coolant film on the electronic devices at all times. Upon coolant delivery to the electronic devices 18, all coolant is returned to the reservoir 80 for reuse. In situations where vapor is generated, the system is designed such that the pressure generated by the vapor assists in the return of the vapor and any condensed or unevaporated coolant back to the reservoir 80.

As the fluid is sprayed upon the electronic devices 18, the fluid engaging the electronic devices 18 may be partially vaporized. The vapor is eventually condensed as the temperature of the vapor is reduced after shutdown. The vapor may also be condensed by pressure increases within the spray enclosure 20 or via the vapor recovery unit 70 during or after operation of the present invention. The non-vaporized fluid passes downwardly within the spray enclosure 20 to the fluid collector 28 where the fluid is then filtered and returned to the reservoir 80 for reuse.

This process continues until the electronic devices 18 are fully burned-in over the required amount of time. Once the burn-in process is completed, the flow of the fluid is terminated. All vapor is recovered during the fluid recovery phase, and unevaporated coolant on the burn-in board 12, sockets and other, is made to evaporate for subsequent recovery. The burn-in board 12 and electronic devices 18 are then removed from the spray enclosure 20 for replacement with other burn-in boards 12 and electronic devices 18.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A spray unit for thermally managing at least one heat producing device, said spray unit comprising:
    at least one electronic device;
    a first portion having a first cavity and at least one first orifice for dispensing a first fluid flow towards said at least one electronic device; and
    a second portion having a second cavity and at least one second orifice for dispensing a second fluid flow;
    wherein said second portion is slidably positioned within said first portion;
    wherein if a temperature of said electronic device is greater than a desired temperature a first force is increased thereby extending said second portion from said first portion, and wherein if said temperature of said electronic device is less than said desired temperature said first force is decreased thereby retracting said second portion with respect to said first portion.

2. The spray unit of claim 1, wherein said second portion extends outwardly from said first portion when a first force is provided to said second portion.

3. The spray unit of claim 2, including at least one bias member connected to said second portion for applying a biasing force upon said second portion opposite of said first force.

4. The spray unit of claim 3, wherein said at least one bias member maintains an end of said second portion substantially flush with an end of said first portion when said first force is less than said biasing force.

5. The spray unit of claim 1, including a tubular portion extending from an inner surface and about said main opening of said first portion, and a channel extending through said first portion fluidly connected to said tubular portion for providing said second fluid flow to said second portion.

6. The spray unit of claim 5, wherein said second portion includes at least one seal member.

7. The spray unit of claim 5, including at least one bias member connected between said tubular portion and said second portion for applying a biasing force upon said second portion.

8. The spray unit of claim 7, wherein said at least one bias member maintains an end of said second portion substantially flush with an end of said first portion when a first force is less than said biasing force, wherein said first force is opposite of said biasing force.

9. The spray unit of claim 1, wherein said second portion has a tubular structure.

10. A spray unit for thermally managing at least one heat producing device, said spray unit comprising:
    at least one heat producing device;
    a first portion having at least one first orifice for dispensing a first fluid flow towards said at least one heat producing device; and
    a second portion having at least one second orifice for dispensing a second fluid flow;
    wherein said second portion is slidably positioned within said first portion;

wherein if a temperature of said electronic device is greater than a desired temperature a first force is increased thereby extending said second portion from said first portion, and wherein if said temperature of said electronic device is less than said desired temperature said first force is decreased thereby retracting said second portion with respect to said first portion.

11. The spray unit of claim 10, wherein said second portion extends outwardly from said first portion when a first force is provided to said second portion.

12. The spray unit of claim 11, including at least one bias member connected to said second portion for applying a biasing force upon said second portion opposite of said first force.

13. The spray unit of claim 12, wherein said at least one bias member maintains an end of said second portion substantially flush with an end of said first portion when said first force is less than said biasing force.

14. The spray unit of claim 10, including a tubular portion extending from an inner surface and about said main opening of said first portion, and a channel extending through said first portion fluidly connected to said tubular portion for providing said second fluid flow to said second portion.

15. The spray unit of claim 14, wherein said second portion includes at least one seal member.

16. The spray unit of claim 14, including at least one bias member connected between said tubular portion and said second portion for applying a biasing force upon said second portion.

17. The spray unit of claim 16, wherein said at least one bias member maintains an end of said second portion substantially flush with an end of said first portion when a first force is less than said biasing force, wherein said first force is opposite of said biasing force.

18. The spray unit of claim 10, wherein said second portion has a tubular structure.

19. A spray unit for thermally managing at least one heat producing device, said spray unit comprising:
- at least one heat producing device;
- a first portion having at least one first orifice for dispensing a first fluid flow towards said at least one heat producing device;
- a second portion having at least one second orifice for dispensing a second fluid flow;
- wherein said second portion is slidably positioned within said first portion;
- wherein said second portion extends outwardly from said first portion when a first force is provided to said second portion; and
- including at least one bias member connected to said second portion for applying a biasing force upon said second portion opposite of said first force.

20. A spray unit for thermally managing at least one heat producing device, said spray unit comprising:
- at least one heat producing device;
- a first portion having at least one first orifice for dispensing a first fluid flow towards said at least one heat producing device;
- a second portion having at least one second orifice for dispensing a second fluid flow;
- wherein said second portion is slidably positioned within said first portion; and
- a tubular portion extending from an inner surface and about said main opening of said first portion, and a channel extending through said first portion fluidly connected to said tubular portion for providing said second fluid flow to said second portion.

\* \* \* \* \*